US012027353B2

(12) United States Patent
Ishibashi et al.

(10) Patent No.: US 12,027,353 B2
(45) Date of Patent: Jul. 2, 2024

(54) SUBSTRATE PROCESSING METHOD AND APPARATUS

(71) Applicant: TOKYO ELECTRON LIMITED, Tokyo (JP)

(72) Inventors: Shota Ishibashi, Yamanashi (JP); Hiroyuki Toshima, Yamanashi (JP); Hiroyuki Iwashita, Yamanashi (JP); Tatsuo Hirasawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/206,768

(22) Filed: Mar. 19, 2021

(65) Prior Publication Data
US 2021/0305032 A1 Sep. 30, 2021

(30) Foreign Application Priority Data
Mar. 24, 2020 (JP) .................................. 2020-053331

(51) Int. Cl.
*H01J 37/34* (2006.01)
*C23C 14/35* (2006.01)
*H01J 37/32* (2006.01)

(52) U.S. Cl.
CPC ........ *H01J 37/3455* (2013.01); *C23C 14/352* (2013.01); *H01J 37/32715* (2013.01); *H01J 37/3414* (2013.01); *H01J 37/3464* (2013.01); *H01J 2237/202* (2013.01)

(58) Field of Classification Search
None
See application file for complete search history.

(56) References Cited

U.S. PATENT DOCUMENTS

| 5,833,815 | A | * | 11/1998 | Kim | ........................ | C23C 14/56 |
|---|---|---|---|---|---|---|
| | | | | | | 204/192.12 |
| 2006/0096851 | A1 | * | 5/2006 | Lavitsky | ............... | C23C 14/352 |
| | | | | | | 204/192.1 |
| 2007/0057625 | A1 | * | 3/2007 | Kim | ........................ | C23C 14/35 |
| | | | | | | 313/506 |
| 2008/0210546 | A1 | * | 9/2008 | Ukishima | ............. | C23C 14/086 |
| | | | | | | 204/192.12 |

FOREIGN PATENT DOCUMENTS

| JP | 2020-146528 A | 9/2020 |
|---|---|---|
| WO | WO 2007/010798 A1 | 1/2007 |

* cited by examiner

*Primary Examiner* — Jason Berman
(74) *Attorney, Agent, or Firm* — Fenwick & West LLP

(57) ABSTRACT

There is provided a substrate processing method of a substrate processing apparatus. The substrate processing apparatus includes at least two targets, magnet-moving mechanisms disposed in one-to-one correspondence with the at least two targets, each of the magnet-moving mechanisms being configured to reciprocate a magnet in a first direction on a back surface of each target, and a substrate moving mechanism configured to move a substrate in a second direction orthogonal to the first direction. The method includes causing the magnet-moving mechanisms to reciprocate the magnets at different phases with each other.

4 Claims, 10 Drawing Sheets

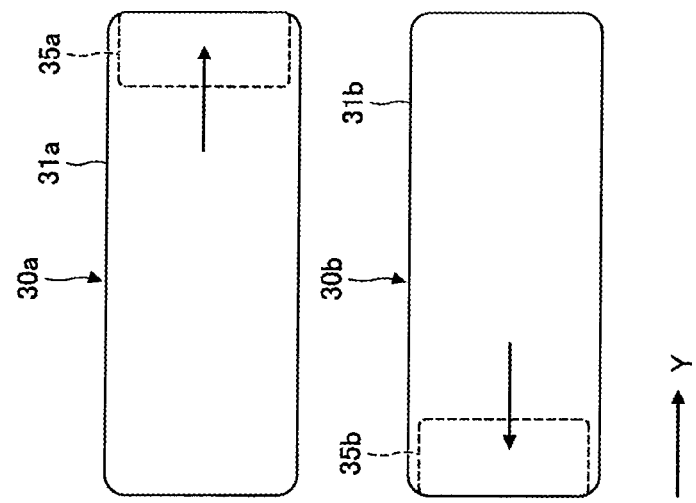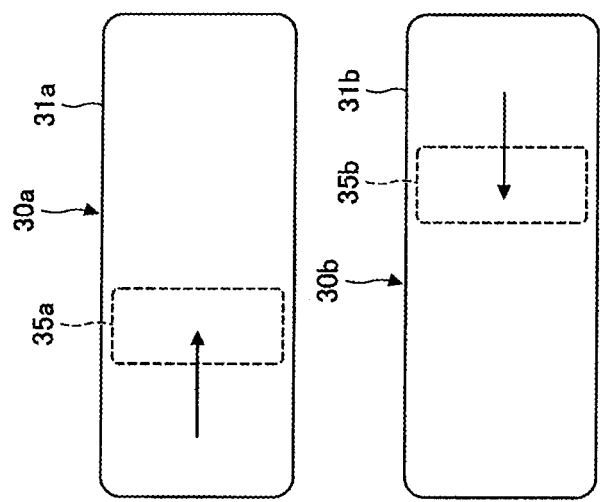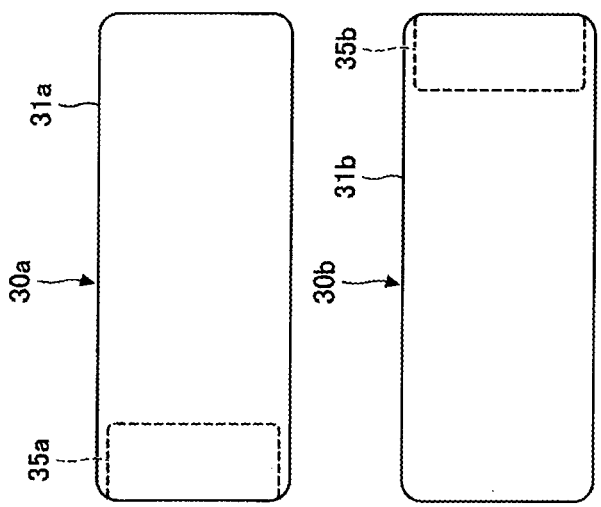

SUBSTRATE PROCESSING METHOD AND APPARATUS

CROSS-REFERENCE TO RELATED APPLICATIONS

This application claims priority to Japanese Patent Application No. 2020-053331, filed on Mar. 24, 2020, the entire contents of which are incorporated herein by reference.

TECHNICAL FIELD

The present disclosure relates to a substrate processing method and apparatus.

BACKGROUND

There is known a substrate processing apparatus for forming a film by allowing sputter particles emitted from a target to be incident on a substrate such as a wafer or the like.

Japanese Patent Application Publication No. 2002-146528 discloses therein a sputter film formation method for sequentially performing sputter film formation while making substrates face at least two magnetron sputter mechanisms during the transfer of the substrates, wherein the at least two magnetron sputter mechanisms are disposed in a film forming chamber and have magnets reciprocating in a substrate transfer direction. When the magnets of the at least two magnetron sputter mechanisms reciprocate, the phases of the reciprocating motion of the magnets are shifted between the at least two magnetron sputter mechanisms, and a moving speed in a positive direction is different from that in a negative direction.

In a substrate processing apparatus for forming a film on a substrate, it is required to improve uniformity of a film thickness.

SUMMARY

One aspect of the present disclosure provides a substrate processing method and apparatus for improving film thickness distribution.

In accordance with an aspect of the present disclosure, there is provided a substrate processing method of a substrate processing apparatus including at least two targets, magnet-moving mechanisms disposed in one-to-one correspondence with the at least two targets, each of the magnet-moving mechanisms being configured to reciprocate a magnet in a first direction on a back surface of each target, and a substrate moving mechanism configured to move a substrate in a second direction orthogonal to the first direction, the method including: causing the magnet-moving mechanisms to reciprocate the magnets at different phases with each other.

BRIEF DESCRIPTION OF THE DRAWINGS

The objects and features of the present disclosure will become apparent from the following description of embodiments, given in conjunction with the accompanying drawings, in which:

FIGS. 4A to 4C are schematic diagrams for explaining an operation of the magnet in a first operation example of the substrate processing apparatus;

DETAILED DESCRIPTION

Figure 1:
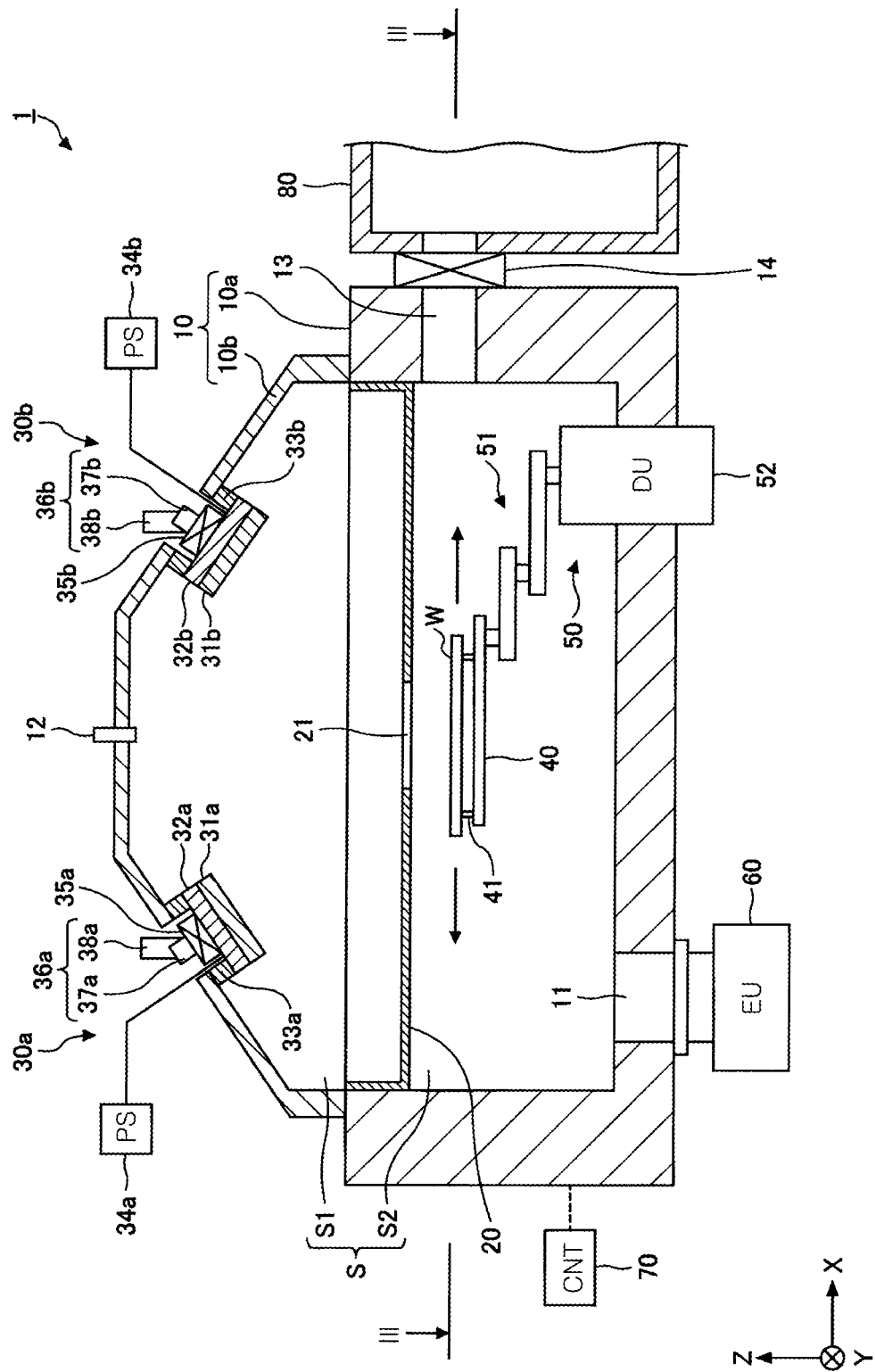
FIG. 1 is an example of a schematic cross-sectional view of a substrate processing apparatus 1 according to one embodiment.

Hereinafter, embodiments of the present disclosure will be described with reference to the accompanying drawings. Like reference numerals will be given to like parts throughout the drawings, and redundant description thereof may be omitted.

<Substrate Processing Apparatus>

Figure 2:
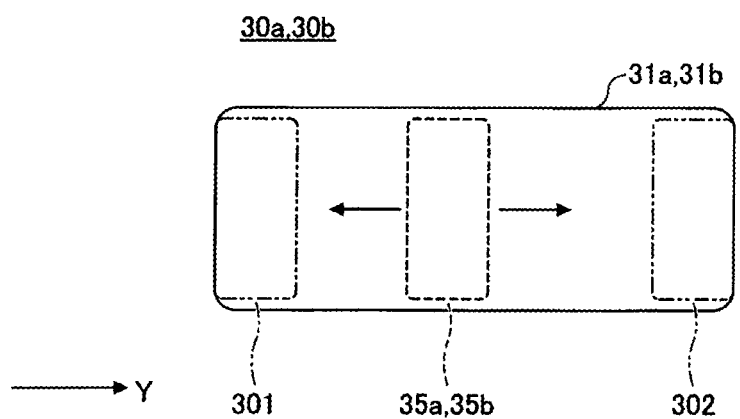
FIG. 2 is an example of a schematic diagram for explaining movement of a magnet in a sputter particle emitting unit.
Figure 3:
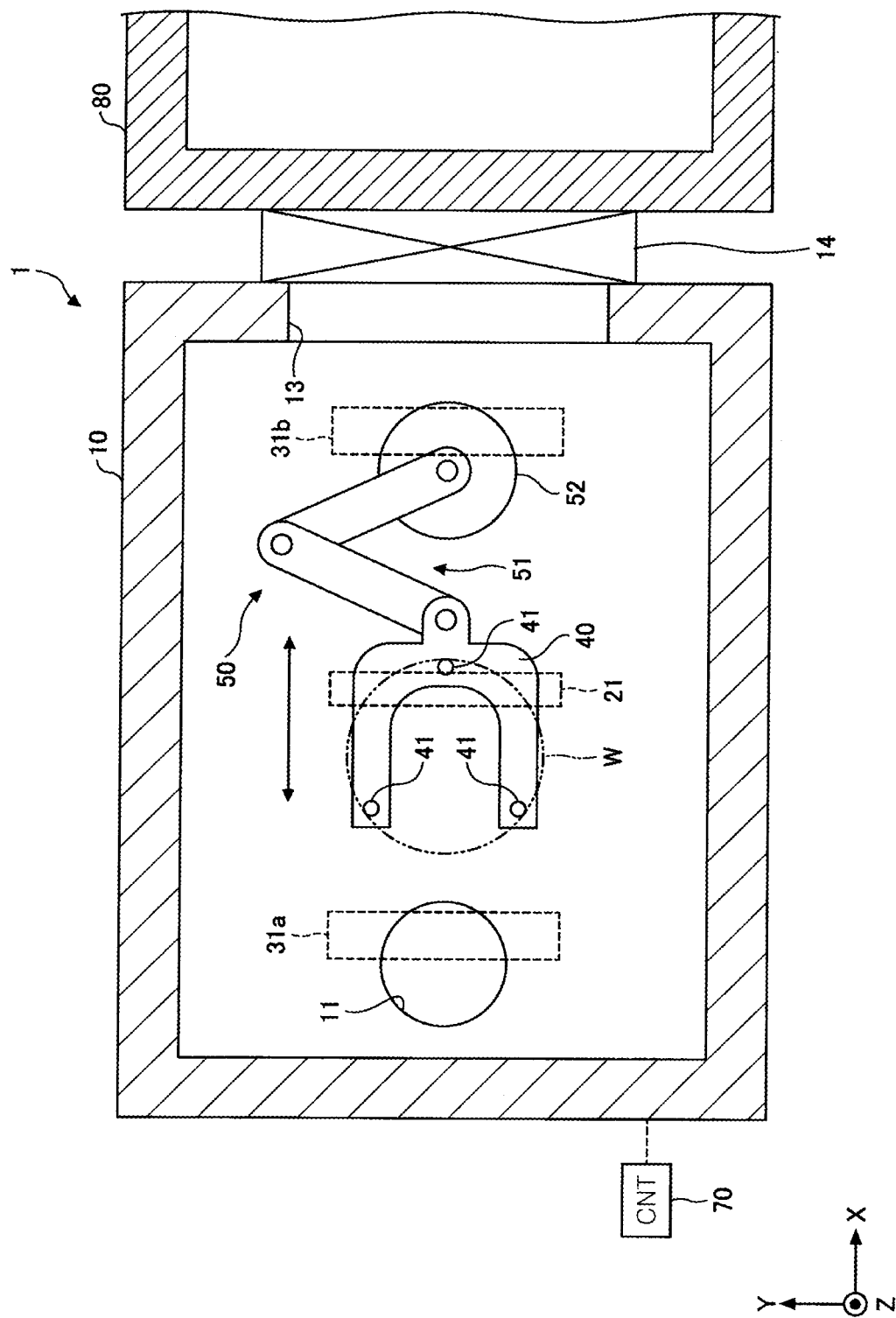
FIG. 3 is an example of a schematic cross-sectional view taken along a line of the substrate processing apparatus of FIG. 1 according to the embodiment.

A substrate processing apparatus 1 according to one embodiment will be described with reference to FIGS. 1 to 3. FIG. 1 is an example of a schematic cross-sectional view of a substrate processing apparatus 1 according to one embodiment. FIG. 2 is an example of a schematic diagram for explaining movement of magnets 35a and 35b in sputter particle emitting units 30a and 30b. FIG. 2 shows the sputter particle emitting units 30a and 30b viewed from sputter particle emitting surfaces of the targets 31a and 31b. FIG. 3 is an example of a schematic cross-sectional view taken along a line of the substrate processing apparatus 1 of FIG. 1 according to the embodiment. In the following description, the X direction indicates one horizontal direction (direction in which a substrate W to be described later is transferred); the Y direction indicates a horizontal direction (direction in which the magnets 35a and 35b to be described later are moved) perpendicular to the X direction; and the Z direction indicates a vertical direction.

The substrate processing apparatus 1 includes a processing chamber 10, a sputter particle shielding plate 20, sputter particle emitting units 30a and 30b, a substrate support 40, a substrate moving mechanism 50, and an exhaust unit (EU) 60. The substrate processing apparatus 1 is, e.g., a physical vapor deposition (PVD) apparatus, and is an apparatus for forming a film by adhering sputter particles (film forming atoms) emitted from the sputter particle emitting units 30a and 30b onto a surface of a substrate W such as a semiconductor wafer or the like placed on the substrate support 40 in the processing chamber 10.

The processing chamber 10 includes a chamber main body 10a having an upper opening and a lid 10b disposed to close the upper opening of the chamber main body 10a. The lid 10b has an inclined surface. An inner space of the processing chamber 10 serves as a processing space S where the film formation is performed.

A gas exhaust port 11 is formed at a bottom portion of the processing chamber 10. The exhaust unit 60 is connected to the gas exhaust port 11. The exhaust unit 60 includes a pressure control valve and a vacuum pump. The processing space S is evacuated to a predetermined vacuum level by the exhaust unit 60.

A gas inlet port 12 for introducing a gas into the processing space S is inserted at the top of the processing chamber 10. A gas supply unit (not shown) is connected to the gas inlet port 12. A sputtering gas (e.g., an inert gas) supplied from the gas supply unit to the gas inlet port 12 is introduced into the processing space S.

A loading/unloading port 13 for loading/unloading the substrate W is formed on a sidewall of the processing chamber 10. The loading/unloading port 13 is opened and closed by a gate valve 14. The processing chamber 10 is disposed adjacent to a transfer chamber 80. The processing chamber 10 and the transfer chamber 80 communicate with each other by opening the gate valve 14. A pressure in the transfer chamber 80 is maintained at a predetermined vacuum level, and a transfer device (not shown) for loading/unloading the substrate W into/from the processing chamber 10 is disposed in the transfer chamber 80.

The sputter particle shielding plate 20 is formed as a substantially plate-shaped member, and is horizontally disposed at an intermediate position in a height direction of the processing space S. An edge of the sputter particle shielding plate 20 is fixed to a sidewall of the chamber main body 10a. The sputter particle shielding plate 20 divides the processing space S into a first space S1 and a second space S2. The first space S1 is disposed above the sputter particle shielding plate 20. The second space S2 is disposed below the sputter particle shielding plate 20.

The sputter particle shielding plate 20 has a slit-shaped through-hole 21 through which sputter particles pass. The through-hole 21 penetrates through the sputter particle shielding plate 20 in a plate thickness direction (Z direction) thereof. The through-hole 21 is formed in a thin and elongated shape with the Y direction that is one horizontal direction in the drawing as a longitudinal direction. A length of the through-hole 21 in the Y direction is greater than a diameter of the substrate W.

The sputter particle emitting unit 30a includes a target 31a, a target holder 32a, an insulating member 33a, a power supply (PS) 34a, a magnet 35a, and a magnet-moving mechanism 36a. The sputter particle emitting unit 30b includes a target 31b, a target holder 32b, an insulating member 33b, a power supply (PS) 34b, a magnet 35b, and a magnet-moving mechanism 36b.

The targets 31a and 31b are made of a material containing a constituent element of a film to be formed, and may be made of a conductive material or a dielectric material. Further, the targets 31a and 31b may be made of the same material or different materials.

The target holders 32a and 32b are made of a conductive material and are disposed above the sputter particle shielding plate 20 and at different positions on an inclined surface of the lid 10b of the processing chamber 10 via the insulating members 33a and 33b. In the example shown in FIG. 1, the target holders 32a and 32b are disposed at positions facing each other with the through-hole 21 interposed therebetween. However, the target holders 32a and 32b may be disposed at any position without being limited thereto. The target holders 32a and 32b hold the targets 31a and 31b such that the targets 31a and 31b are positioned obliquely above the through-hole 21.

The power supplies 34a and 34b are electrically connected to the target holders 32a and 32b, respectively. The power supplies 34a and 34b may be DC power supplies when the targets 31a and 31b are made of a conductive material. The power supplies 34a and 34b may be radio-frequency (RF) power supplies when the targets 31a and 31b are made of a dielectric material. When the power supplies 34a and 34b are the RF power supplies, they are connected to the target holders 32a and 32b via a matching unit. By applying a voltage to the target holders 32a and 32b, a sputtering gas is dissociated around the targets 31a and 31b. Then, ions in the dissociated sputtering gas collide with the targets 31a and 31b, and the sputter particles that are particles of the constituent material of the targets 31a and 31b are emitted from the targets 31a and 31b.

The magnets 35a and 35b are disposed on back surfaces of the target holders 32a and 32b, and are configured to reciprocate (move) in the Y direction by the magnet-moving mechanisms 36a and 36b, respectively. The magnet-moving mechanisms 36a and 36b have, e.g., guides 37a and 37b and driving units 38a and 38b, respectively. The magnets 35a and 35b are guided by the guides 37a and 37b to reciprocate in the Y direction, respectively. The driving units 38a and 38b reciprocate the magnets 35a and 35b along the guides 37a and 37b, respectively. As shown in FIG. 2, the magnets 35a and 35b are disposed on the back surfaces of the targets 31a and 31b when viewed from the sputter particle emitting surfaces of the targets 31a and 31b, respectively, and are configured to reciprocate between two end positions 301 and 302 indicated by dashed double-dotted lines.

The ions in the dissociated sputtering gas are attracted by magnetic fields of the magnets 35a and 35b and collide with the targets 31a and 31b. When the magnet-moving mechanisms 36a and 36b reciprocate the magnets 35a and 35b in the Y direction, respectively, the position where the ions collide with the targets 31a and 31b, i.e., the position where the sputter particles are emitted, is changed.

The substrate support 40 is disposed in the chamber main body 10a of the processing chamber 10 and horizontally supports the substrate W via support pins 41. The substrate support 40 is configured to be moveable linearly in the X direction that is one horizontal direction by the substrate moving mechanism 50. Therefore, the substrate W supported by the substrate support 40 is linearly moved in a horizontal plane by the substrate moving mechanism 50. The substrate moving mechanism 50 has a multi joint arm 51 and a driving unit (DU) 52, and is configured to move the substrate support 40 in the X direction by driving the multi joint arm 51 with the driving unit 52.

In other words, the moving direction (Y direction) of the magnets 35a and 35b and the moving direction (X direction) of the substrate W are orthogonal to each other. Further, the sputter particle emitting units 30a and 30b are disposed at both ends when viewed in the moving direction (X direction) of the substrate W.

A controller (CNT) 70 includes a computer and controls the respective components of the substrate processing apparatus 1, such as the power supplies 34a and 34b, the driving units 38a and 38b, the driving unit 52, the exhaust unit 60 and the like. The controller 70 includes a main controller having a CPU for actually controlling those components, an input device, an output device, a display device, and a storage device. The storage device stores parameters of various processes executed by the substrate processing apparatus 1, and a storage medium in which a program, i.e., a processing recipe, for controlling the processes executed by the substrate processing apparatus 1 is stored is set in the storage device. The main controller of the controller 70 calls a predetermined processing recipe stored in the storage medium, and causes the substrate processing apparatus 1 to execute a predetermined process based on the processing recipe.

Next, a film forming method in the substrate processing apparatus 1 according to the first embodiment will be described.

First, after the processing space S in the processing chamber 10 is exhausted, a sputtering gas (e.g., an inert gas) is introduced into the processing space S from the gas inlet port 12 to adjust a pressure in the processing space S to a predetermined pressure.

Next, the substrate support 40 is positioned at a substrate transfer position, and the gate valve 14 is opened so that the substrate W is placed on the substrate support 40 (on the support pins 41) by the transfer device (not shown) of the transfer chamber 80. Next, the transfer device is returned to the transfer chamber 80, and the gate valve 14 is closed.

Next, the controller 70 controls the substrate moving mechanism 50 (the driving unit 52) to move the substrate W on the substrate support 40 in the X direction, and also controls the sputter particle emitting units 30a and 30b (the power supplies 34a and 34b and the driving units 38a and 38b) to obliquely emit sputter particles from the targets 31a and 31b.

Here, the sputter particles are emitted by applying a voltage from the power supplies 34a and 34b to the target holders 32a and 32b such that the ions in the sputtering gas dissociated around the targets 31a and 31b collide with the targets 31a and 31b. Further, the magnet-moving mechanisms 36a and 36b reciprocate the magnets 35a and 35b in the Y direction, respectively, to change the position where the ions collide with the targets 31a and 31b, i.e., the position where the sputter particles are emitted.

The sputter particles obliquely emitted from the targets 31a and 31b of the sputter particle emitting units 30a and 30b pass through the through-hole 21 formed in the sputter particle shielding plate 20 and are obliquely incident on the substrate W to be deposited thereon.

Here, in the substrate processing apparatus 1, in the case of forming a film on the substrate W, the substrate W moves in the X direction and the sputter particle emission positions (the positions of the magnets 35a and 35b) on the sputter particle emission surfaces of the targets 31a and 31b are moved in the Y direction. Therefore, the film thickness distribution may be non-uniform in the X direction of the substrate W. Further, in the case of forming a film on the substrate W, for example, the speed at which the substrate W is moved in the X direction is increased, so that the number of sputter particles incident on the substrate W is reduced and a thin film is formed on the substrate W. By increasing the speed at which the substrate W is moved in the X direction, the non-uniformity of the film thickness distribution of the substrate W in the X direction may become worse.

On the other hand, in the substrate processing apparatus 1, the thickness uniformity of the film formed on the substrate W is improved by controlling the operations of the magnets 35a and 35b.

First Operation Example

Figure 5:
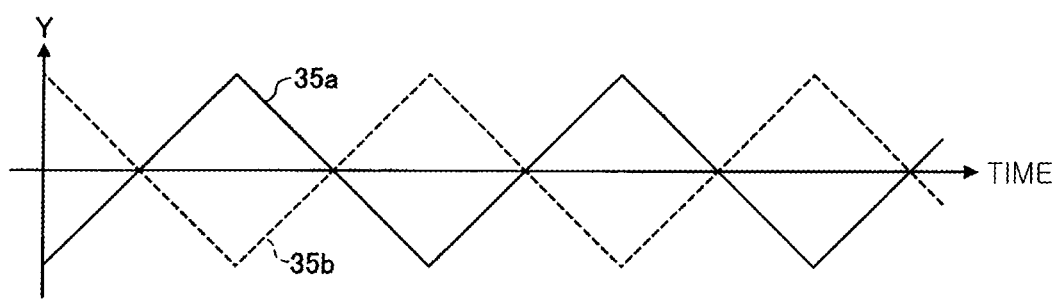
FIG. 5 is an example of a graph for explaining the operation of the magnet in the first operation example of a substrate processing apparatus.

FIGS. 4A to 4C are schematic diagrams for explaining the operations of the magnets 35a and 35b in a first operation example of the substrate processing apparatus 1. FIG. 5 is an example of a graph for explaining the operations of the magnets 35a and 35b in the first operation example of the substrate processing apparatus 1. Here, the substrate processing apparatus 1 causes the sputter particle emitting units 30a and 30b to emit sputter particles. In the graph shown in FIG. 5, the horizontal axis indicates time, and the vertical axis indicates positions of the magnets 35a and 35b in the Y direction.

FIG. 4A shows exemplary positions of the magnets 35a and 35b at the start of the film formation. As shown in FIG. 4A, the moving (oscillating) phases of the magnets 35a and 35b are different. Specifically, the moving phases of the magnet 35a and the magnet 35b shown in FIG. 4A are shifted by 180°. Here, the magnet 35a is located at one end position 301 (see FIG. 2) and the magnet 35b is located at the other end position 302 (see FIG. 2). The substrate W is disposed at a film formation start position (not shown).

When the film formation is started, the substrate W is moved in the X direction under the through-hole 21, and the magnets 35a and 35b reciprocate. FIG. 4B shows exemplary positions of the magnets 35a and 35b after the elapse of time. The magnet 35a moves toward the other end position 302. The magnet 35b moves toward one end position 301. FIG. 4C shows exemplary positions of the magnets 35a and 35b after the elapse of time. The magnet 35a reaches the other end position 302. The magnet 35b reaches one end position 301. Then, as shown in FIG. 5, the magnets 35a and 35b reciprocate in the Y direction while maintaining the phase difference.

According to the first operation example of the substrate processing apparatus 1, in the substrate processing apparatus 1 for forming a film on the substrate W using the two sputter particle emitting units 30a and 30b, the magnets 35a and 35b reciprocate at different phases. Accordingly, the non-uniformity of the film thickness in the X direction of the substrate W can be suppressed and the film thickness uniformity can be improved, compared to the configuration in which the multiple magnets 35 reciprocate at the same phase.

Although the case in which there are two sputter particle emitting units 30 (30a and 30b) has been described as an example, the number of the sputter particle emitting units is not limited thereto, and there may be multiple sputter particle emitting units. Further, although the case in which the phase difference is 180° has been described, the phase difference is not limited thereto. For example, the phase difference may be changed depending on the number of the sputter particle emitting units 30. For example, in a configuration including four sputter particle emitting units 30, the four magnets 35 may have a phase difference of 90°.

Second Operation Example

FIGS. 6A to 6F are schematic diagrams for explaining the operation of the magnet 35a in a second operation example of the substrate processing apparatus 1. FIG. 7 is an example of a graph for explaining the operation of the magnet 35a in the second operation example of the substrate processing apparatus 1. Here, the substrate processing apparatus 1 causes only the sputter particle emitting unit 30a to emit sputter particles. Further, the substrate processing apparatus 1 forms a film while moving the substrate W in the X direction multiple times using the substrate moving mechanism 50. In the graph shown in FIG. 7, the horizontal axis represents time and the vertical axis represents the position of the magnet 35a in the Y direction. Further, the position of the magnet 35a in the Y direction during the first film formation is indicated by a solid line, and the position of the magnet 35a in the Y direction during the second film formation is indicated by a dashed line.

Figure 6A:
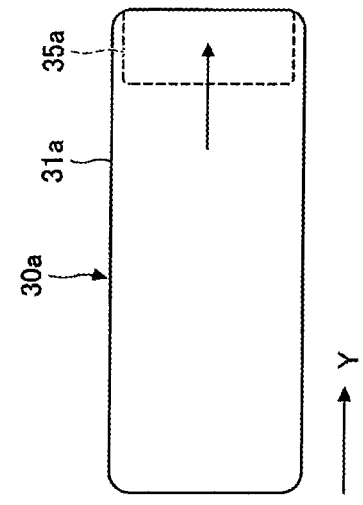
FIGS. 6A to 6F are schematic diagrams for explaining the operation of the magnet in a second operation example of the substrate processing apparatus.
Figure 7:
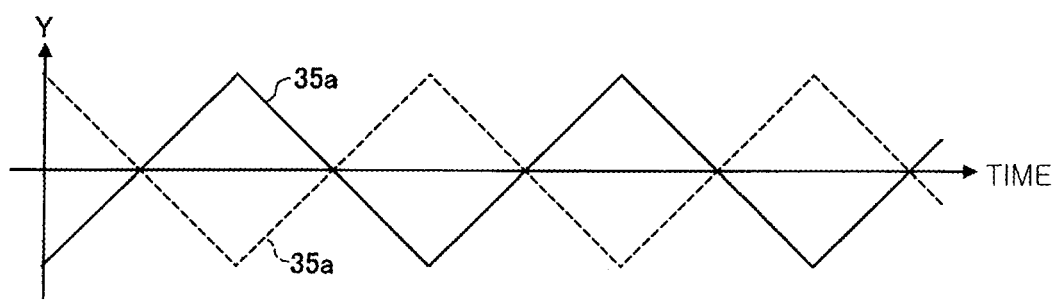
FIG. 7 is an example of a graph for explaining the operation of the magnet in the second operation example of the substrate processing apparatus.

FIG. 6A shows an exemplary position of the magnet 35a at the start of the first film formation. Here, the magnet 35a is located at one end position 301 (see FIG. 2). The substrate W is located at the film formation start position (not shown).

Figure 6B:
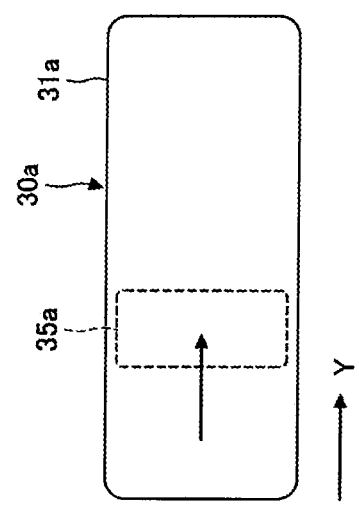
Figure 6C:
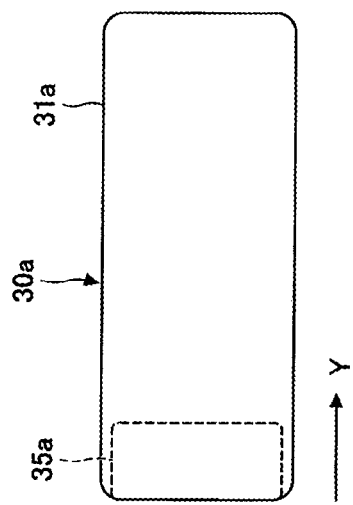

When the first film formation is started, the substrate W is moved in the X direction under the through-hole 21, and the magnet 35a reciprocates. FIG. 6B shows an exemplary position of the magnet 35a after the elapse of time. The magnet 35a moves toward the other end position 302 (see FIG. 2). FIG. 6C shows an exemplary position of the magnet 35a after the elapse of time. The magnet 35a reaches the other end position 302. Then, the magnet 35a reciprocates in the Y direction as indicated by the solid line in FIG. 7.

When the first film formation is finished, the application of the voltage by the power supply 34 is stopped, and the substrate W is returned to the film formation start position (not shown).

Figure 6D:
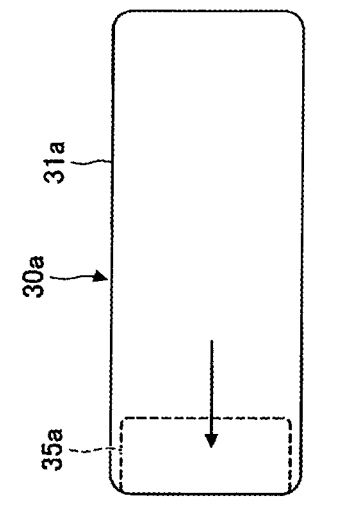

FIG. 6D shows an exemplary position of the magnet 35a at the start of the second film formation. Referring to the comparison between FIG. 6A and FIG. 6B, the magnet 35a at the start of the first film formation and the magnet 35a at the start of the second film formation have different moving (oscillating) phases. Specifically, the moving phases of the magnet 35a are shifted by 180°

Figure 6E:
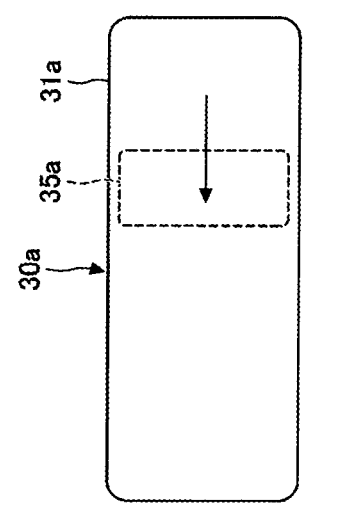
Figure 6F:
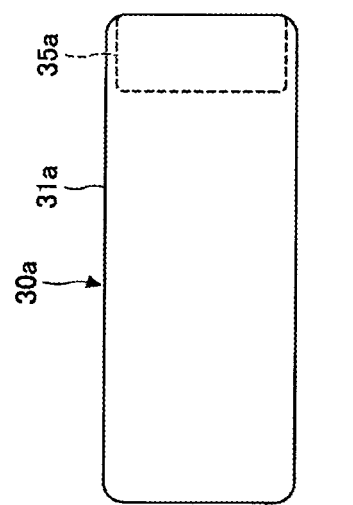

When the second film formation is started, the substrate W is moved in the X direction under the through-hole hole 21, and the magnet 35a reciprocates. FIG. 6E shows an exemplary position of the magnet 35a after the elapse of time. The magnet 35a moves toward one end position 301 (see FIG. 2). FIG. 6F shows an exemplary position of the magnet 35a after the elapse of time. The magnet 35a reaches one end position 301. Then, the magnet 35a reciprocates in the Y direction as indicated by the dashed line in FIG. 7. In this manner, the magnet 35a at the time of the second film formation reciprocates while maintaining the phase difference with the magnet 35a at the time of the first film formation.

As described above, according to the second operation example of the substrate processing apparatus 1, in the substrate processing apparatus 1 for forming a film on the substrate by repeating the process of moving the substrate W in the X direction, the magnet 35a reciprocates while changing the phase in each step. Accordingly, the non-uniformity of the film thickness of the substrate W in the X direction can be suppressed, and the film thickness uniformity can be improved.

The film formation is not necessarily performed twice, and may be performed multiple times. Further, although the case in which the phase difference is 180° has been described, the phase difference is not limited thereto. The phase difference may be changed depending on the number of execution of film formation. For example, the phase difference may be 90° in a configuration for performing film formation four times.

Although the case in which the sputter particles are emitted from one sputter particle emitting units 30a has been described in the second operation example of the substrate processing apparatus 1, the present disclosure is not limited thereto. The sputter particles may be emitted from the sputter particle emitting units 30a and 30b. Further, the moving (oscillating) phases of the magnets 35a and 35b may be different in the sputter particle emitting units 30a and 30b. For example, the magnet 35a at the time of the first film formation, the magnet 35b at the time of the first film formation, the magnet 35a at the time of the second film formation, and the magnet 35b at the time of the second film formation may have a phase difference of 90°.

Third Operation Example

Figure 9:
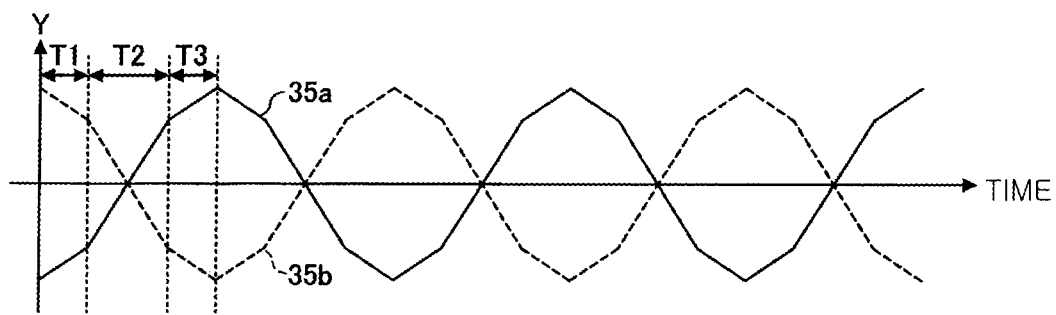
FIG. 9 is an example of a graph for explaining the operation of the magnet in the third operation example of the substrate processing apparatus.
Figure 10:
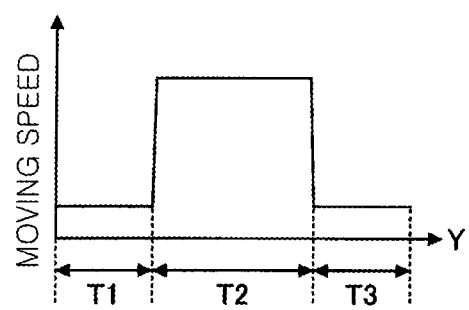
FIG. 10 is an example of a graph showing a relationship between a position of a magnet and a speed.

FIGS. 8A to 8D are schematic diagrams for explaining the operations of the magnets 35a and 35b in the third operation example of the substrate processing apparatus 1. FIG. 9 is an example of a graph for explaining the operations of the magnets 35a and 35b in the third operation example of the substrate processing apparatus 1. FIG. 10 is an example of a graph showing a relationship between the positions of the magnets 35a and 35b and speeds. Here, the substrate processing apparatus 1 causes the sputter particle emitting units 30a and 30b to emit sputter particles. In the graph shown in FIG. 9, the horizontal axis indicates time, and the vertical axis indicates the positions of the magnets 35a and 35b in the Y direction.

Figure 8:
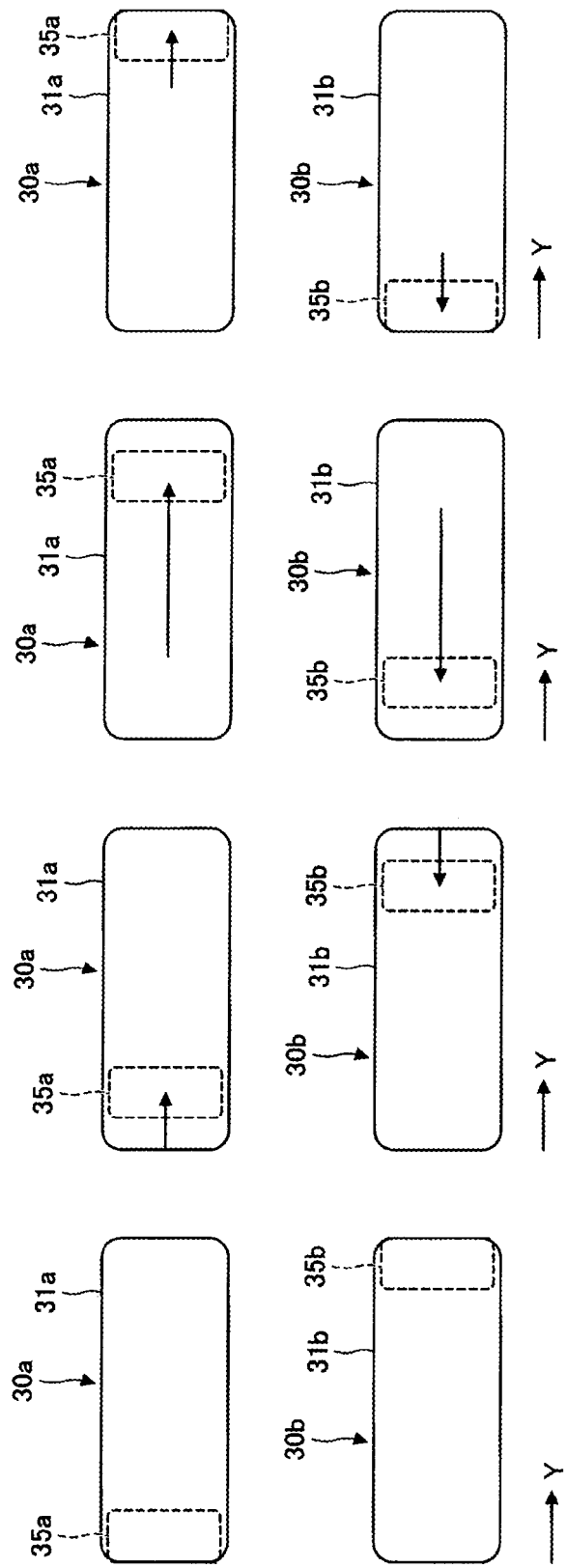
FIGS. 8A to 8D are schematic diagrams for explaining the operation of the magnet in a third operation example of the substrate processing apparatus.

FIG. 8A shows the positions of the magnets 35a and 35b at the start of film formation. As shown in FIG. 8A, the moving phases of the magnets 35a and 35b are different. Specifically, the moving phases of the magnets 35a and 35b shown in FIG. 8A are shifted by 180°. Here, the magnet 35a is disposed at one end position 301 (see FIG. 2) and the magnet 35b is located at the other end position 302 (see FIG. 2). The substrate W is disposed at the film formation start position (not shown).

When the film formation is started, the substrate W is moved in the X direction under the through-hole 21, and the magnets 35a and 35b reciprocate. Here, in the third operation example, the moving speeds of the magnets 35a and 35b are adjusted. Specifically, as shown in FIG. 10, the moving speeds are adjusted depending on the positions of the magnets 35a and 35b in the Y direction.

FIG. 8B shows examples of the magnets 35a and 35b in a section T1. In a region corresponding to the section T1 of FIG. 10, the moving (oscillating or reciprocating) speeds of the magnets 35a and 35b are slower than those in a section T2 to be described later.

FIG. 8C shows examples of the magnets 35a and 35b in the section T2. In a region corresponding to the section T2 of FIG. 10, the moving speeds of the magnets 35a and 35b are faster than those in the section T1.

FIG. 8D shows examples of the magnets 35a and 35b in a section T3. In a region corresponding to the section T3 of FIG. 10, the moving speeds of the magnets 35a and 35b are slower than those in the section T2. Then, as shown in FIG. 9, the magnets 35a and 35b reciprocate in the Y direction while maintaining the phase difference.

As described above, according to the third operation example of the substrate processing apparatus 1, in the substrate processing apparatus 1 for forming a film on the substrate W using the two sputter particle emitting units 30a and 30b, the magnets 35a and 35b reciprocates at different phases. Further, in the section T2 where the magnets 35a and 35b become close to each other in the Y direction, the moving speeds of the magnets 35a and 35b are relatively faster than those in the sections T1 and T3. Accordingly, the amount of film formation is reduced. Further, in the sections T1 and T3 where the magnets 35a and 35b becomes distant from each other, the moving speeds of the magnets 35a and 35b are relatively slower than those in the section T2. Accordingly, the amount of film formation is increased. As a result, the non-uniformity of the film thickness of the substrate W in the X direction can be suppressed, and the film thickness uniformity can be improved.

Although the case in which there are two sputter particle emitting units 30 (30a and 30b) has been described as an example, the number of the sputter particle emitting units is not limited thereto, and there may be multiple sputter particle emitting units. Further, although the case in which the phase difference is 180° has been described, the phase difference is not limited thereto. For example, the phase difference may be changed depending on the number of the sputter particle emitting units 30. For example, in a configuration including four sputter particle emitting units 30, the four magnets 35 may have a phase difference of 90°.

Further, the adjustment of the moving speed of the magnet 35a shown in FIG. 10 may be applied to the second operation example of the substrate processing apparatus 1.

Figure 11:
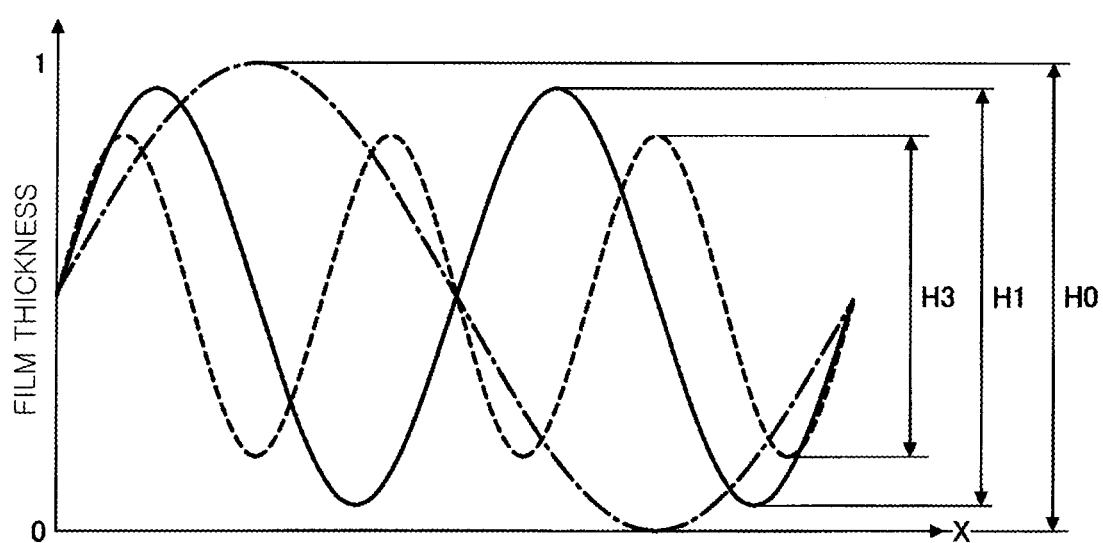
FIG. 11 is a graph showing an example of film thickness distribution.

FIG. 11 is a graph showing an example of the film thickness distribution. In the graph shown in FIG. 11, the vertical axis indicates a film thickness, and the horizontal axis indicates the X direction of the substrate W. A solid line indicates the film thickness distribution in the first operation example (the second operation example); a dashed line indicates the film thickness distribution in the third operation example; and a dashed dotted line indicates the film thickness distribution in a reference example. Here, in the reference example, it is assumed that the magnets 35a and 35b are moved at the same phase. The film thickness on the vertical axis is normalized while setting a maximum variation width H0 of the reference example to 1.

As shown in FIG. 11, in the reference example, the film thickness varies periodically within the maximum variation width H0 (=1). Further, the cycle of the film thickness variation in the reference example depends on the time required for the magnets 35a and 35b to reciprocate once.

On the other hand, in the first operation example (the second operation example), a maximum variation width H1 of the film thickness is 0.88, and the variation of the film thickness can be suppressed. In addition, an amplitude cycle in the X direction is also shortened. The cycle of the film thickness variation in the first operation example (the second operation example) depends on the time for the magnets 35a and 35b to move from one end to the other end. Therefore, the cycle of the film thickness variation in the first operation example (the second operation example) becomes ½ of the cycle of the film thickness variation in the reference example.

Further, in the third operation example, a maximum variation width H3 of the film thickness is 0.68, and the variation of the film thickness can be further suppressed. In addition, the amplitude cycle in the X direction is also shortened. The cycle of the film thickness variation in the third operation example depends on the time for the magnets 35a and 35b to move from one end to the other end. By increasing the moving speed in the section T2, the cycle of the film thickness variation in the third operation example becomes shorter than the cycle of the film thickness variation in the first operation example (the second operation example). Accordingly, the film thickness uniformity can be improved.

While the substrate processing apparatus 1 has been described above, the present disclosure is not limited to the above-described embodiment or the like, and various modifications and improvements can be made within the scope of the gist of the present disclosure described in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method of a substrate processing apparatus for forming a film on a substrate, the apparatus including at least two targets positioned obliquely above the substrate, magnet-moving mechanisms disposed in one-to-one correspondence with the at least two targets, each of the magnet-moving mechanisms being configured to reciprocate a magnet horizontally in a first direction on a back surface of each target, a substrate moving mechanism configured to move a substrate in a second direction orthogonal to the first direction, and a shielding plate dividing a first space in which the at least two targets are provided and a second space in which the magnet-moving mechanisms are provided, the shielding plate having a through-hole, through which sputter particles emitted from the at least two targets pass, formed in a slit shape along the second direction, a length of the through-hole in the first direction being greater than a diameter of the substrate, a path along which the magnet reciprocates comprises: a first section including a first end portion to a first location on the path that is between the first end portion and a central portion of the path, with the magnet being controlled to move at a substantially constant first moving speed from the first end portion to the first location of the first section; a second section from the first location to a second location of the path such that the central portion is between the first location and the second location, with the magnet being controlled to move at a substantially constant second moving speed which is faster than the first moving speed from the first location to the second location of the second section; and a third section from the second location to a second end portion of the path, with the magnet being controlled to move at a substantially constant third moving speed that is slower than the second moving speed from the second location to the second end portion of the third section, the method comprising:

causing the magnet-moving mechanisms to reciprocate the magnets at different phases with each other.

2. A substrate processing apparatus comprising:
a target;
a magnet-moving mechanism configured to reciprocate a magnet in a first direction on a back surface of the target;
a substrate moving mechanism configured to move a substrate in a second direction orthogonal to the first direction; and
a controller configured to perform the substrate processing method described in claim 1.

3. A substrate processing method of a substrate processing apparatus for forming a film on a substrate, the apparatus including at least two targets positioned obliquely above the substrate in a third direction that is orthogonal to a first direction and a second direction, magnet-moving mechanisms disposed in one-to-one correspondence with the at least two targets, each of the magnet-moving mechanisms being configured to reciprocate a magnet in the first direction on a back surface of each target, and a substrate moving mechanism configured to move a substrate in the second direction orthogonal to the first direction, the method comprising:

causing the magnet-moving mechanisms to reciprocate the magnets at different phases with each other along the first direction but not the third direction and the second direction, each magnet reciprocating between a first end portion of the target to a second end portion of the target without the magnet extending past the first end portion and the second end portion, wherein a moving speed of the magnet varies depending on a position in the reciprocating movement such that the magnet moves from the first end portion of the target to a first location of the target that is between a center portion of target and the first end portion at a substantially constant first moving speed, the magnet moves from the first location to a second location such that the center portion is between the first location and the second location at a substantially constant second moving speed that is faster than the first moving speed, and the magnet moves from the second location to the second end portion of the target at a substantially third moving speed that is slower than the second moving speed, a maximum variation width of the film's thickness is 0.68 in a graph, in which a vertical axis represents the film's thickness and a horizontal axis represents the second direction along which the substrate moves, wherein the film's thickness of the vertical axis is normalized such that a maximum variation width of a reference example in which the magnets are moved at the same phase is set to 1.

4. A substrate processing apparatus comprising:

a target;

a magnet-moving mechanism configured to reciprocate a magnet in a first direction on a back surface of the target;

a substrate moving mechanism configured to move a substrate in a second direction orthogonal to the first direction; and a controller configured to perform the substrate processing method described in claim 3.

* * * * *